US008436435B2

(12) United States Patent
Chan et al.

(10) Patent No.: US 8,436,435 B2
(45) Date of Patent: May 7, 2013

(54) MEMS CAPACITIVE MICROPHONE

(75) Inventors: Chun-Kai Chan, Hsinchu (TW); Weileun Fang, Hsinchu (TW)

(73) Assignee: National Tsing Hua University, Hsinchu (TW)

(*) Notice: Subject to any disclaimer, the term of this patent is extended or adjusted under 35 U.S.C. 154(b) by 180 days.

(21) Appl. No.: 12/844,436

(22) Filed: Jul. 27, 2010

(65) Prior Publication Data

US 2012/0025334 A1 Feb. 2, 2012

(51) Int. Cl.
*H01L 29/84* (2006.01)

(52) U.S. Cl.
USPC .................... 257/416; 257/419; 257/E29.324

(58) Field of Classification Search .................. 257/416, 257/419; 381/174
See application file for complete search history.

(56) References Cited

U.S. PATENT DOCUMENTS 5,490,220 A 2/1996 Loeppert
5,870,482 A 2/1999 Loeppert et al.
2005/0102721 A1* 5/2005 Barth ........................ 977/DIG. 1
2006/0093171 A1* 5/2006 Zhe et al. ........................ 381/191
2007/0087466 A1* 4/2007 Weigold et al. .................. 438/53
2011/0116650 A1* 5/2011 Umetsu et al. .................. 381/86
2012/0027235 A1* 2/2012 Chan et al. .................... 381/174

FOREIGN PATENT DOCUMENTS

WO WO 2010044136 * 4/2010

OTHER PUBLICATIONS

Mingching Wu, et al.,"A molded surface-micromachining and bulk etching release (MOSBE) fabrication platform on (111) Si for MOEMS", Journal of Micromechanics and Microengineering, vol. 15, 2005, pp. 260-265.

* cited by examiner

*Primary Examiner* — A. Sefer
(74) *Attorney, Agent, or Firm* — Muncy, Geissler, Olds & Lowe, PLLC

(57) ABSTRACT

The present invention discloses an MEMS capacitive microphone including a rigid diaphragm arranged on an elastic element. When a sound wave acts on the rigid diaphragm, the rigid diaphragm is moved parallel to a normal of a back plate by elasticity of the elastic element. Thereby the variation of the capacitance is obtained between the rigid diaphragm and the back plate.

8 Claims, 9 Drawing Sheets

MEMS CAPACITIVE MICROPHONE

FIELD OF THE INVENTION

The present invention relates to an MEMS capacitive microphone, particularly to an MEMS capacitive microphone using a rigid diaphragm.

BACKGROUND OF THE INVENTION

The current tendency is toward fabricating slim, compact, lightweight and high-performance electronic products, including microphones. A microphone is used to receive sound and convert acoustic signals into electric signals. Microphones are extensively used in daily-life appliances, such as telephones, mobiles phones, recording pens, etc. For a capacitive microphone, variation of sound forces the diaphragm to deform correspondingly in a type of acoustic waves. The deformation of the diaphragm induces capacitance variation. The variation of sounds can thus be obtained via detecting the voltage difference caused by capacitance variation.

Distinct from the conventional electret condenser microphones (ECM), mechanical and electronic elements of MEMS (Micro Electro-Mechanical Systems) microphones can be integrated on a semiconductor material by the IC (Integrated Circuit) technology to fabricate a miniaturized microphone. Now, MEMS microphones have become the mainstream of miniaturized microphones. MEMS microphones have advantages of compactness, lightweightness and low power consumption. Further, MEMS microphones can be fabricated with a surface-mount method, can bear a higher reflow temperature, can be easily integrated with a CMOS process and other audio electronic devices, and are more likely to resist radio frequency (RF) and electromagnetic interference (EMI).

Refer to FIG. 1 for a diagram schematically showing the structure of a conventional MEMS microphone. The conventional MEMS microphone 1 comprises a back plate 2, a diaphragm 3 and a spacer 4. The spacer 4 is interposed between the back plate 2 and the diaphragm 3 to insulate the diaphragm 3 from the back plate 2 and make the back plate 2 and the diaphragm 3 parallel to each other. Thus, the back plate 2 and the diaphragm 3 respectively form a lower electrode and an upper electrode of a parallel capacitor plate. The back plate 2 has a plurality of air holes 5 which are corresponding to the diaphragm 3 penetrating the back plate 2. The air holes 5 intercommunicate with a back chamber 7 formed on a silicon substrate 6.

Applying voltage to the back plate 2 and diaphragm 3 makes them respectively carry opposite charges and form a capacitor structure. A capacitance equation correlates to a parallel electrode plate is $C=\epsilon A/d$, wherein $\epsilon$ is the dielectric constant, A is the overlapped area of the two electrode plates, and d is the gap between the two capacitor plates. According to the equation, variation of the gap between the two capacitor plates will change the capacitance. When an acoustic wave causes the diaphragm 3 to vibrate and deform, the gap between the back plate 2 and the diaphragm 3 varies. Thus, the capacitance also varies to be converted into electric signals and output. The disturbed or compressed air between the diaphragm 3 and the back plate 2 is released to the back chamber 7 via the air holes 5 lest drastic pressure damage the diaphragm 3 and the back plate 2.

Refer to FIG. 2 for a diagram schematically showing the package structure of a conventional MEMS microphone. The conventional MEMS microphone 1 is installed on a baseplate

8 and packaged inside a holding space formed by a metallic cover 9. The diaphragm 3 and the back plate 2 are respectively electrically connected with a conversion chip 10. The conversion chip 10 converts the variation of the capacitance between the back plate 2 and the diaphragm 3 into electric signals to be output.

The conventional MEMS microphones adopt a flexible diaphragm. The sound pressure induces the deformation of the diaphragm and changes the gap between the diaphragm and the back plate, whereby the capacitance is varied. However, the flexible diaphragm is fabricated with a film-deposition method at a very high temperature. As different materials respectively have different thermal expansion coefficients, the diaphragm would accumulate tensile or compressive stress with different levels. Residual stress on the diaphragm will cause the warping or buckles of the diaphragm and lower the precision of detection. Moreover, due to the sensitivity of a microphone is inversely proportional to the residual stress of the diaphragm, higher residual stress results in low sensitivity. An U.S. Pat. No. 5,490,220 entitled "Solid State Condenser and Microphone Devices" proposes a suspended diaphragm without the constant boundary, wherein a cantilever is used to support the diaphragm, such that the diaphragm is suspended to release stress caused by temperature effect. Another U.S. Pat. No. 5,870,482 entitled "Miniature Silicon Condenser Microphone" designs a large plate diaphragm with only one side fastened.

However, a flexible diaphragm cannot be always parallel to the back plate when deforming. Thus, it is hard to estimate variation of the gap between the diaphragm and the back plate, and the precision is insufficient. Moreover, the sensitivity of a microphone is proportional to the driving voltage. When a higher voltage is used to enhance the sensitivity of a microphone, the conventional flexible diaphragm may collapse and attach to the back plate. In such a case, the microphone fails.

SUMMARY OF THE INVENTION

One objective of the present invention is to provide a high-precision, high-sensitivity, and easy-fabrication MEMS (Micro Electro-Mechanical Systems) capacitive microphone.

To achieve the abovementioned objective, the present invention proposes an MEMS capacitive microphone, which adopts a rigid diaphragm and an elastic element, wherein the rigid diaphragm keeps parallel to a back plate when it is moved with respect to the back plate. The MEMS capacitive microphone of the present invention comprises a base, a back plate, an elastic element, and a rigid diaphragm. The base has a back chamber formed thereon. The back plate and the elastic element are arranged in the base. The back plate has a plurality of air holes interconnecting with the back chamber. The rigid diaphragm is arranged on the elastic element and parallel to the back plate. When a sound wave acts on the rigid diaphragm, the elasticity of the elastic element makes the rigid diaphragm move parallel to the normal of the back plate.

In the present invention, the rigid diaphragm is moved parallel to the back plate by the elasticity or deformation of the elastic element. Thereby, the variation of the capacitance between the rigid diaphragm and the back plate only correlates to the gap therebetween. Thus is promoted the precision and sensitivity of the microphone while detecting or receiving the sound.

Below, the embodiments will be described in detail in cooperation with the drawings to demonstrate the technical contents of the present invention.

DETAILED DESCRIPTION OF THE PREFERRED EMBODIMENTS

The present invention proposes an MEMS capacitive microphone, which adopts a rigid diaphragm and an elastic element, wherein the rigid diaphragm keeps parallel to a back plate when it is moved with respect to the back plate. The technical contents of the present invention are described in detail in accompany with the drawings below.

Figure 1:
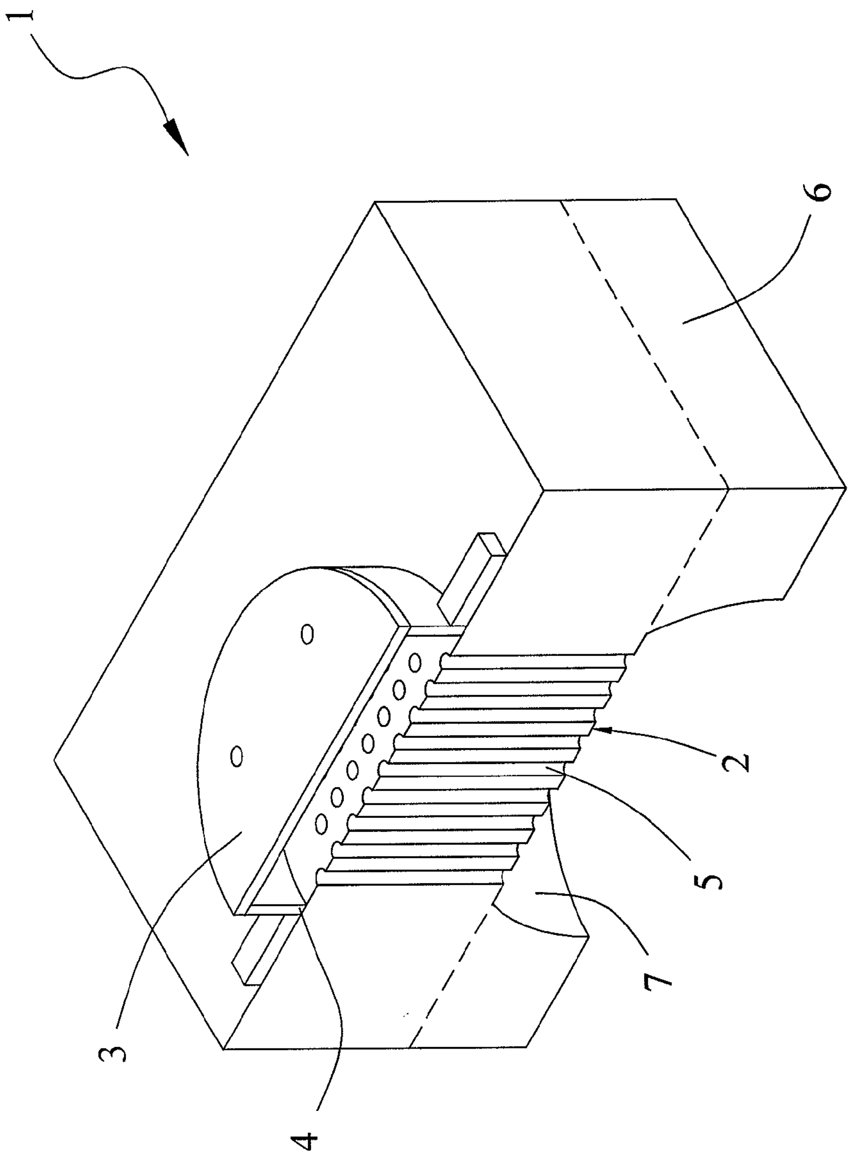
Fig.1 (PRIOR ART)
FIG. 1 is a diagram schematically showing the structure of a conventional MEMS microphone.
Figure 2:
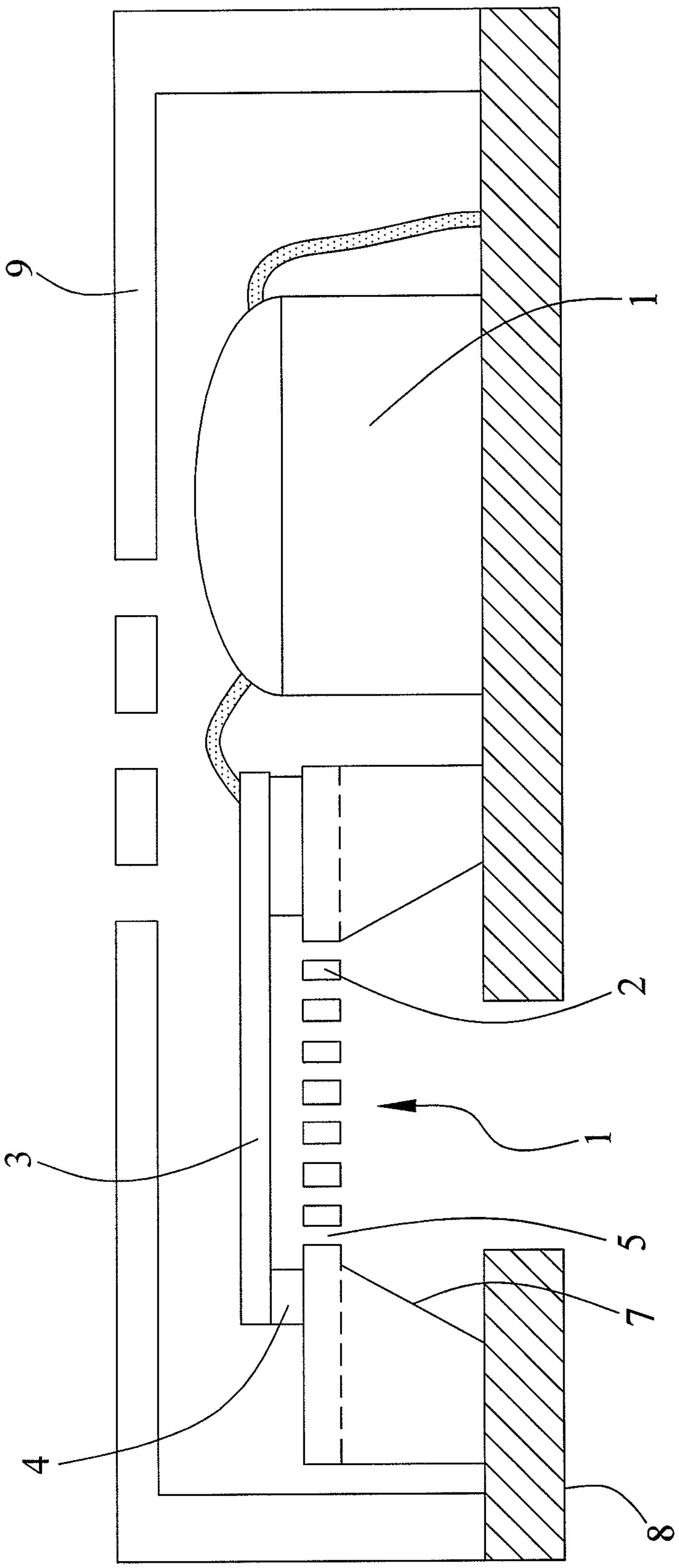
Fig.2 (PRIOR ART)
FIG. 2 is a diagram schematically showing the package structure of a conventional MEMS microphone.
Figure 3A:
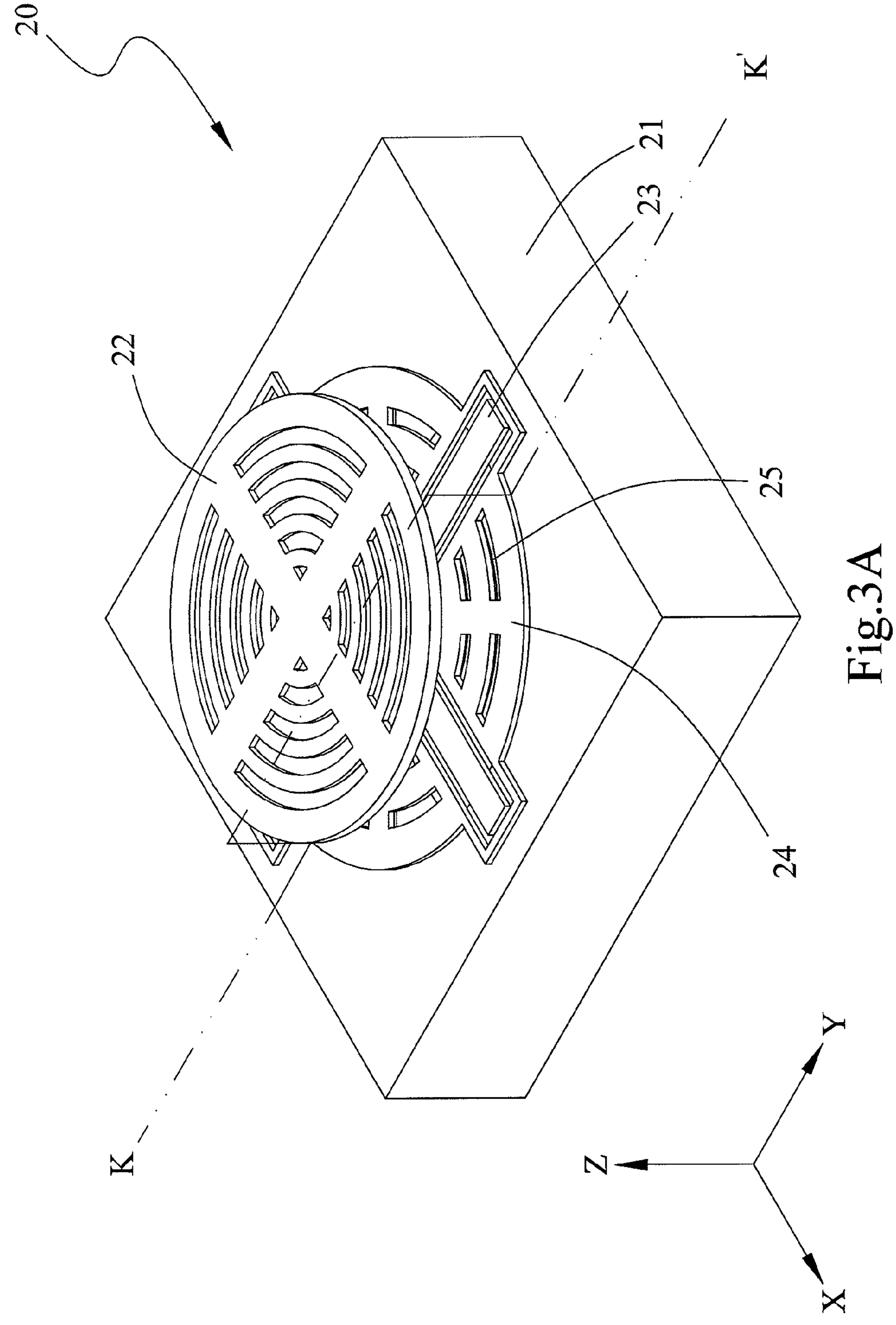
FIG. 3A is a perspective view of an MEMS capacitive microphone according to one embodiment of the present invention.
Figure 3B:
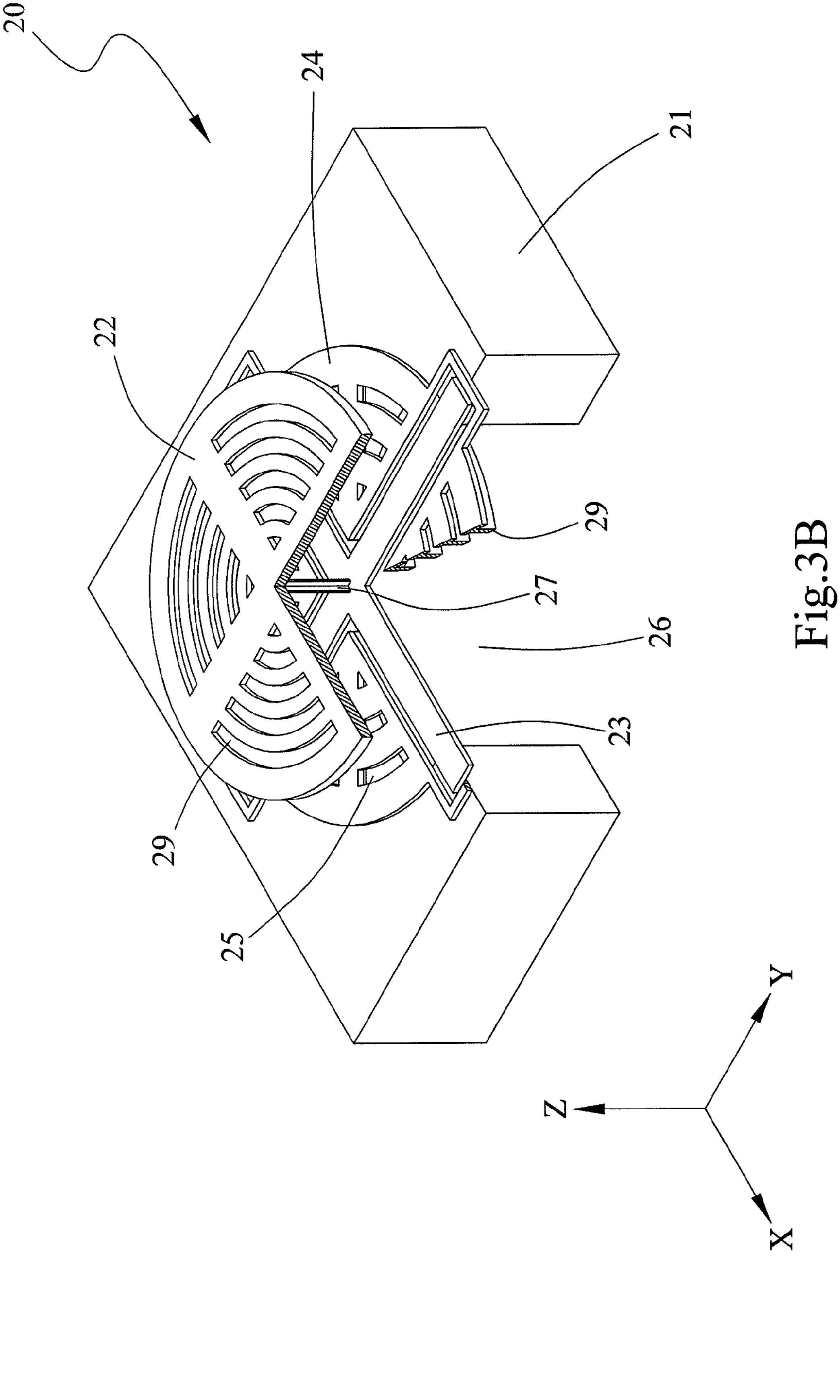
FIG. 3B is a perspective sectional view of an MEMS capacitive microphone according to one embodiment of the present invention.

Refer to FIG. 3A and FIG. 3B. In one embodiment, the MEMS capacitive microphone 20 of the present invention comprises a base 21, a rigid diaphragm 22, an elastic element 23, and a back plate 24. The back plate 24 is arranged on the base 21. The back plate 24 has a plurality of air holes 25 communicating with the back plate 24. The base 21 has a back chamber 26 corresponding to the back plate 24, and the air holes 25 interconnect with the back chamber 26. The rigid diaphragm 22 is fixed on the elastic element 23 and parallel to one side of the back plate 24. The back plate 24 forms a static end with respect to the rigid diaphragm 22. The rigid diaphragm 22 may be moved by the elasticity of the elastic element 23 and forms a movable end with respect to the back plate 24. Thus, when a sound wave acts on the rigid diaphragm 22 and the rigid diaphragm 22 is moved with respect to the back plate 24, the rigid diaphragm 22 always keeps parallel to the back plate 24 when moving parallel to the normal of the back plate 24, i.e. the z axis. According to the abovementioned capacitance equation of a parallel electrode plate, the variation of the capacitance between the rigid diaphragm 22 and the back plate 24 is rewritten to $\Delta C=\epsilon A/(d-\Delta x)$, wherein $\Delta x$ is the displacement of the rigid diaphragm 22 acted by acoustic pressure, d is the original gap between the back plate 24 and the rigid diaphragm 22 before acted by acoustic pressure. Comparing with a conventional flexible diaphragm that the gap between the back plate 24 and each point of the diaphragm has different displacement, the variation of capacitance only correlates with $\Delta x$ in the present invention. Therefore, the present invention can provide a greater capacitance variation output and enhance the sensitivity of a microphone.

Refer to FIG. 3B. In the abovementioned embodiment, the base 21 may be a silicon substrate with a circular back chamber 26 formed thereon. The elastic element 23 is in form of a cross-shape plate with four ends fixed to the perimeter of the back chamber 26 of the base 21. The rigid diaphragm 22 is formed in a circular shape and is fastened on the intersection of the elastic element 23 by an anchor element 27. Thus, the rigid diaphragm 22 is parallel to the plane constructed by the elastic element 23. The anchor element 27 has one end relative to the elastic element 23 fixed to the center of the rigid diaphragm 22. The anchor element 27 can maintain physical balance of the rigid diaphragm 22 while supporting the rigid diaphragm 22 and facilitate stress release of the rigid diaphragm 22 in a thermal fabrication process.

Figure 4:
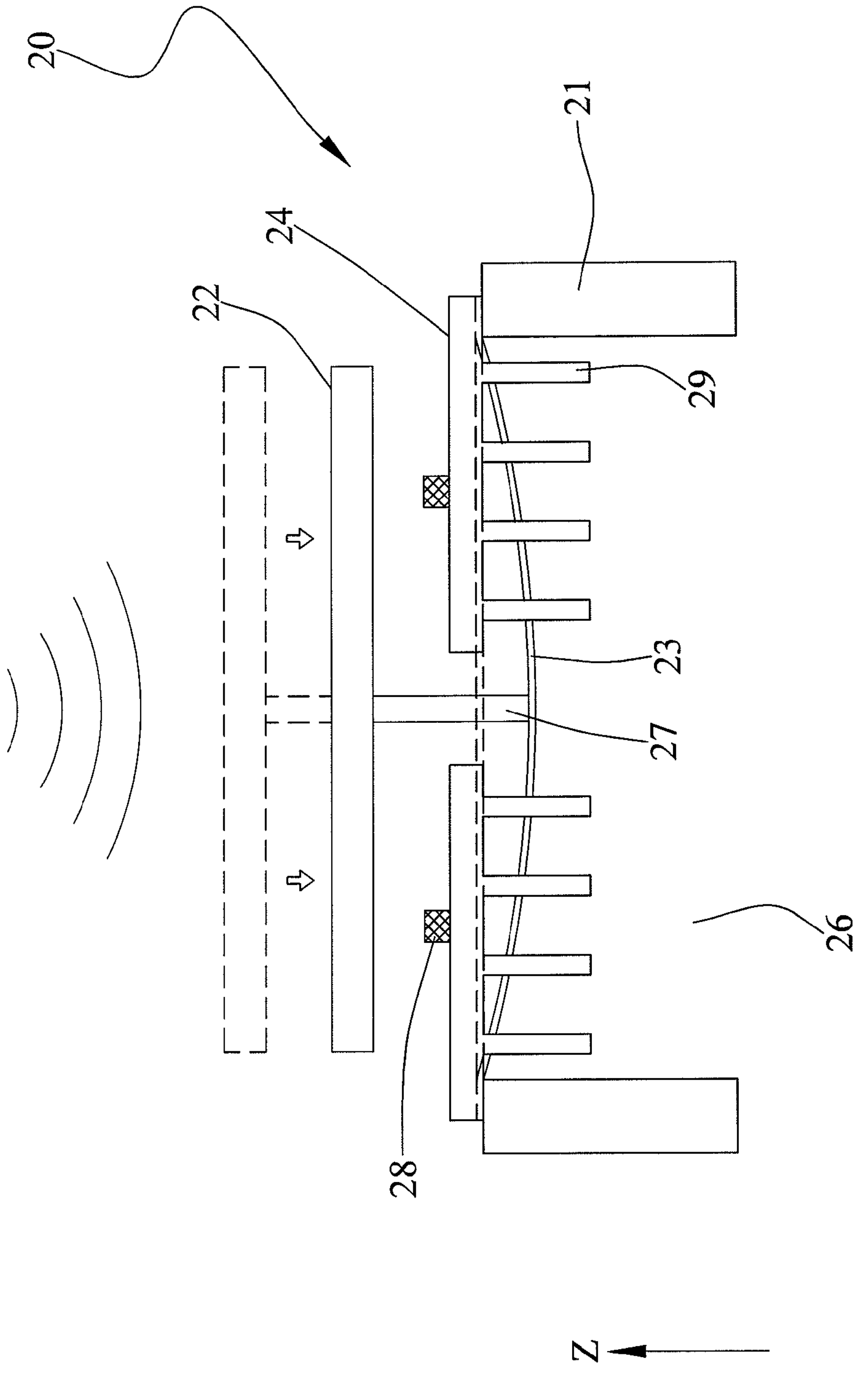
FIG. 4 is a diagram schematically showing the operation of an MEMS capacitive microphone according to one embodiment of the present invention.

The back plate 24 is fixedly installed on one side of the back chamber 26 of the base 21. The back plate 24 has a plurality of air holes 25 formed thereon and reserves a holding space for receiving the elastic element 23. The rigid diaphragm 22 is arranged above the back plate 24 and parallel to the back plate 24, whereby they are formed in a parallel capacitor plate structure. Refer to FIG. 4, when the MEMS capacitive microphone 20 is in operation, the positive and negative voltages are respectively applied to the rigid diagram 22 and the back plate 24, whereby the rigid diagram 22 and the back plate 24 respectively carry positive charges and negative charges to form a parallel capacitor plate. When a sound wave acts on one surface of the rigid diaphragm 22, the acoustic pressure is transmitted to the elastic element 23 and deforms the elastic element 23. Thus, the rigid diaphragm 22 is moved toward the back plate 24 (the Z axis), and the capacitance therebetween is changed. By means of analyzing and operating the capacitance variation of an external circuit, sound signals are converted into electric signals to be output.

In the abovementioned embodiment, the MEMS capacitive microphone 20 of the present invention further comprises at least one insulation element 28 (as shown in FIG. 4) arranged between the rigid diaphragm 22 and the back plate 24. The insulation element 28 may be arranged on one surface of the rigid diaphragm 22 facing the back plate 24, or arranged on one surface of the back plate 24 facing the rigid diaphragm 22. In FIG. 4, two insulation elements 28 are respectively arranged on two sides of the back plate 24. When the rigid diaphragm 22 bears too much acoustic pressure to cause too much displacement toward the back plate 24, the insulation element 28 can provide cushion effect and function as electric separation of the rigid diaphragm 22 from the back plate 24 lest the electric contact of the rigid diaphragm 22 and the back plate 24 damage the microphone.

In the abovementioned embodiment, the rigid diaphragm 22 includes a plurality of reinforcing members (not shown in the drawings), such as reinforcing ribs. The reinforcing members are arranged on one side of the rigid diaphragm 22 to enhance the strength of the rigid diaphragm 22 and maintain the rigidity of the rigid diaphragm 22. In practice, the reinforcing members are realized with a trench-backfilling technology.

In one embodiment, the back plate 24 includes a plurality of reinforcing members 29, such as reinforcing ribs. The reinforcing members 29 are arranged on one side of the back plate 24 back on the rigid diaphragm 22 to enhance the strength of the back plate 24 and maintain the rigidity of the back plate 24.

For convenient illustration, the parts having different functions are separately defined hereinbefore. However, it should be noted that the abovementioned parts can be fabricated independently and then assembled together, or fabricated directly with an MEMS or semiconductor process, such as the etching, photolithographing, and refilling technologies. For example, an MEMS capacitive microphone 20 can be fabricated with a MOSBE platform, which was disclosed in "The Molded Surface-micromachining and Bulk Etching Release (MOSBE) Fabrication Platform on (111) Si for MOEMS"

(Journal of Micromechanics and Microengineering, vol. 15, pp. 260-265) in 2005. Thus, it is not repeated herein.

Figure 5A:
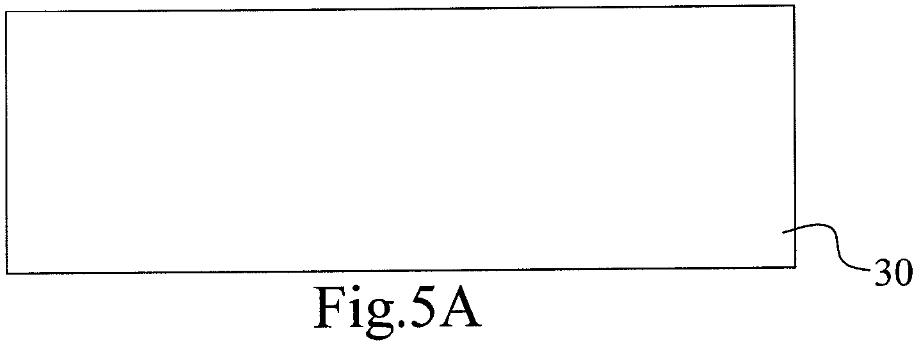
FIGS. 5A-5I are sectional views schematically showing the process of fabricating an MEMS capacitive microphone according to one embodiment of the present invention.
Figure 5B:
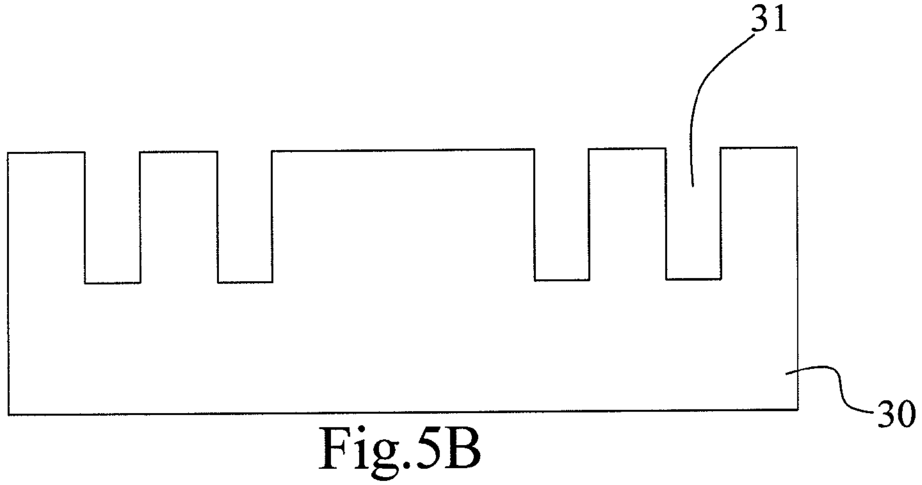
Figure 5C:
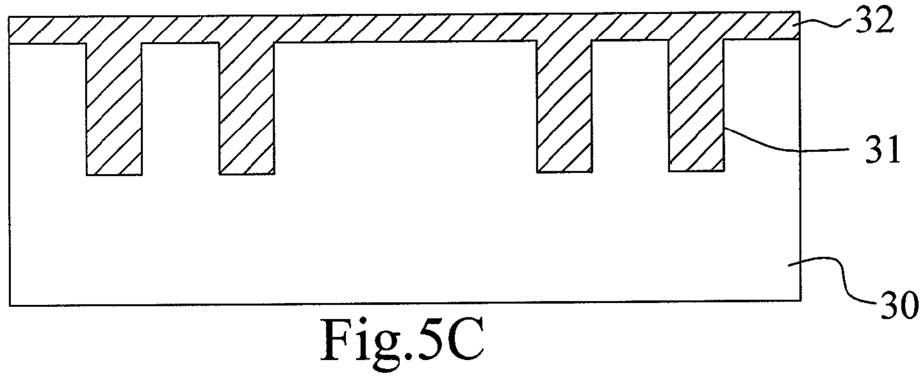
Figure 5D:
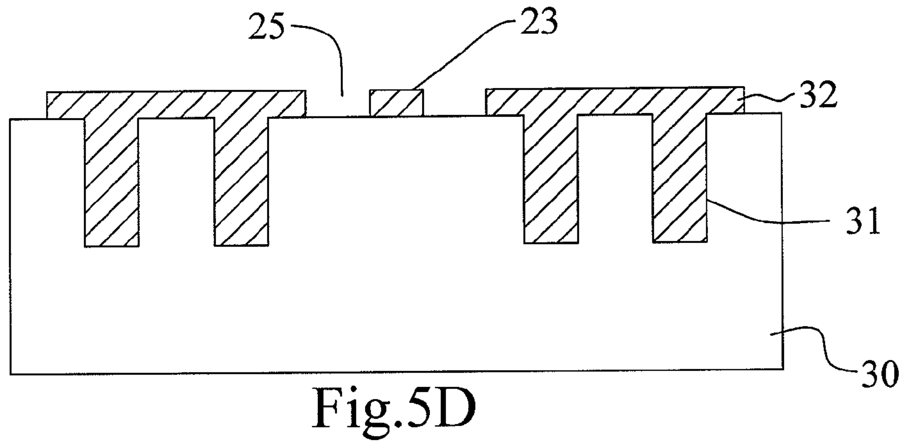

Refer to FIGS. 5A-5I for sectional views schematically showing the process of fabricating the MEMS capacitive microphone 20 according to one embodiment of the present invention, wherein the sectional views are taken along Line K-K' in FIG. 3A, and electric wiring processes of different elements are omitted if the omission does not affect the implementation and understanding of the present invention. Firstly, prepare a substrate for fabricating the base 21, such as a silicon substrate 30, as shown in FIG. 5A. Next, define the installation position of the back plate 24 on the silicon substrate 30, and fabricate trenches 31 for forming the reinforcing members 29 on the silicon substrate 30 via an etching method, as shown in FIG. 5B. Next, deposit a poly-silicon layer 32 on the silicon substrate 30 to refill the trenches 31 to form the reinforcing members 29 of the back plate 24, as shown in FIG. 5C. Next, define the positions of the elastic element 23 and the air holes 25 on the poly-silicon layer 32 and define the area of the back plate 24 via etching the poly-silicon layer 32, as shown in FIG. 5D. The reinforcing members 29 can maintain the flatness and rigidity of the back plate 24. The elasticity of the elastic element 23 can be adjusted via varying the thickness of the poly-silicon layer or selecting the material thereof.

Figure 5E:
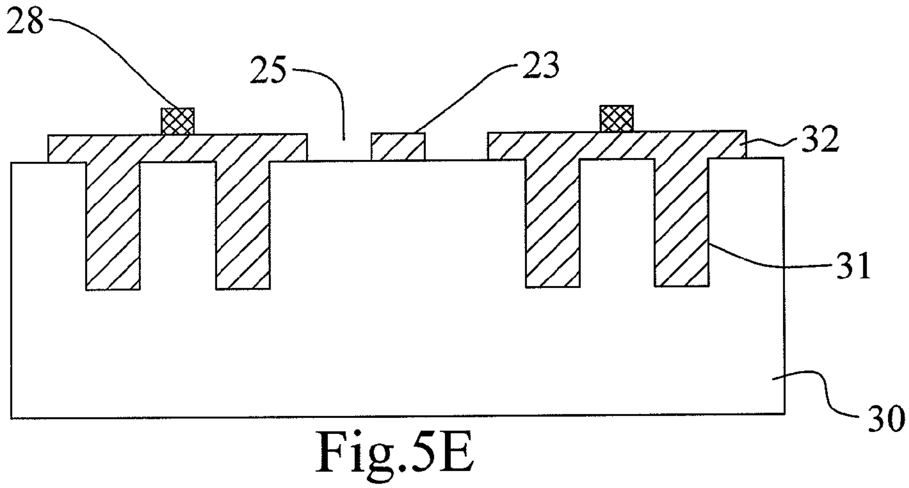
Figure 5F:
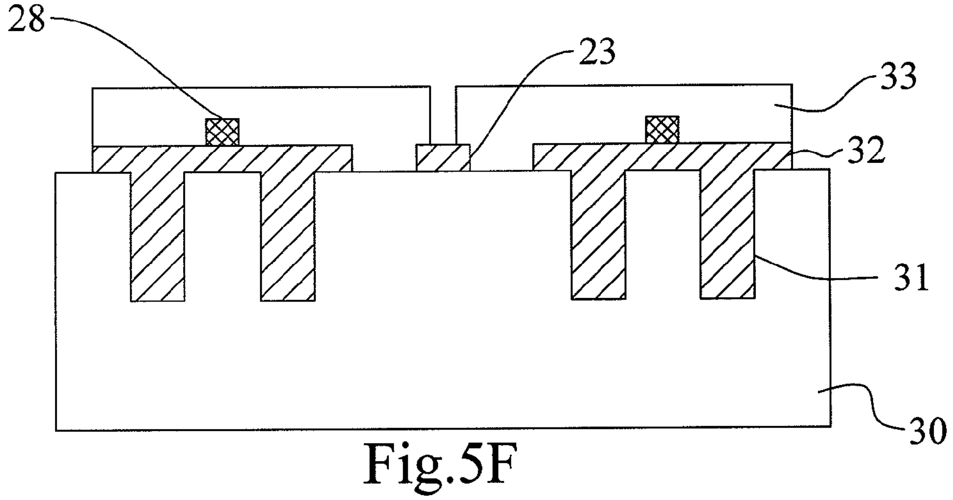
Figure 5G:
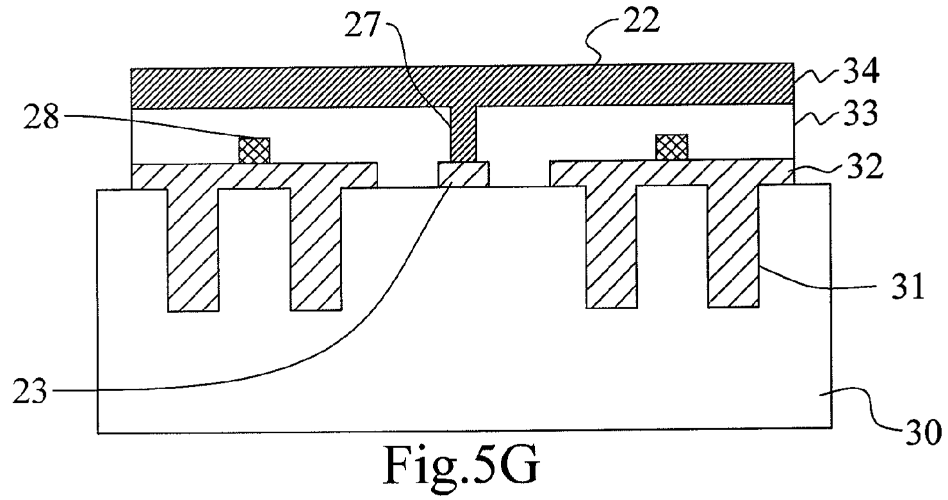
Figure 5H:
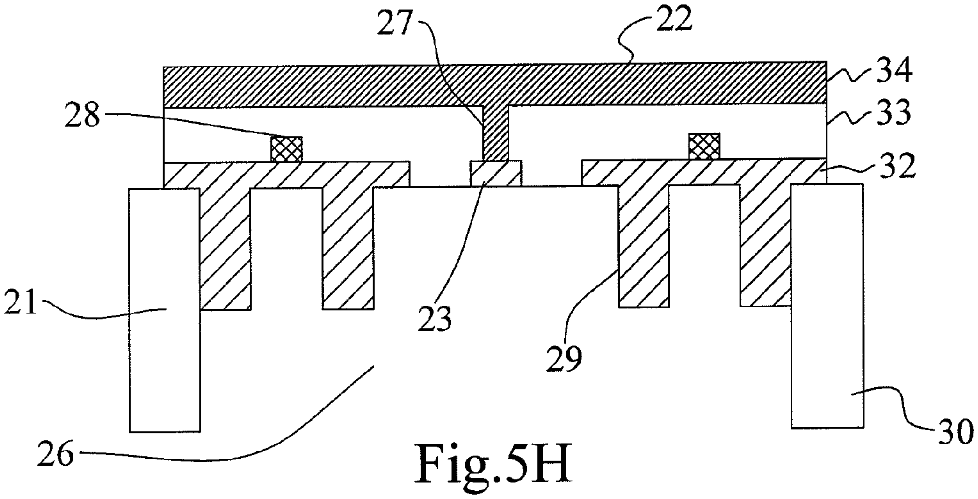
Figure 5I:
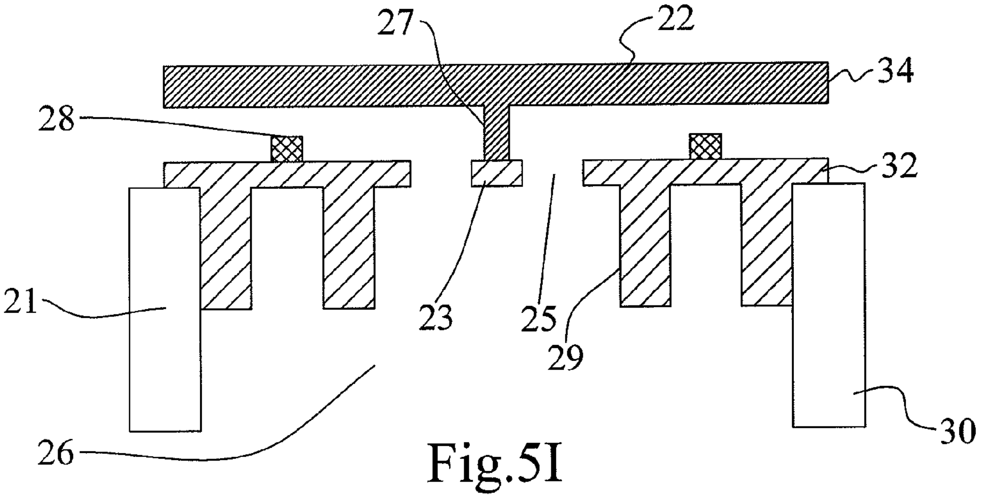

Next, form the insulation elements 28 on the back plate 24, as shown in FIG. 5E. In one embodiment, the insulation elements 28 are made of silicon nitride ($Si_3N_4$). Next, form an intermediary layer 33 on the back plate 24, and define the position for forming the anchor element 27 on the elastic element 23, as shown in FIG. 5F. In one embodiment, the intermediary layer 33 is made of silicon dioxide ($SiO_2$). Next, deposit a poly-silicon layer 34 on the intermediary layer 33 for forming the rigid diaphragm 22 and the anchor element 27, as shown in FIG. 5G. Next, etch the bottom of the silicon substrate 30 to form the back chamber 26, as shown in FIG. 5H. Then, remove the intermediary layer 33 via etching such that the rigid diaphragm 22 is supported by the anchor element 27 on the elastic element 23 and parallel to the back plate 24, as shown in FIG. 5I.

Figure 6:
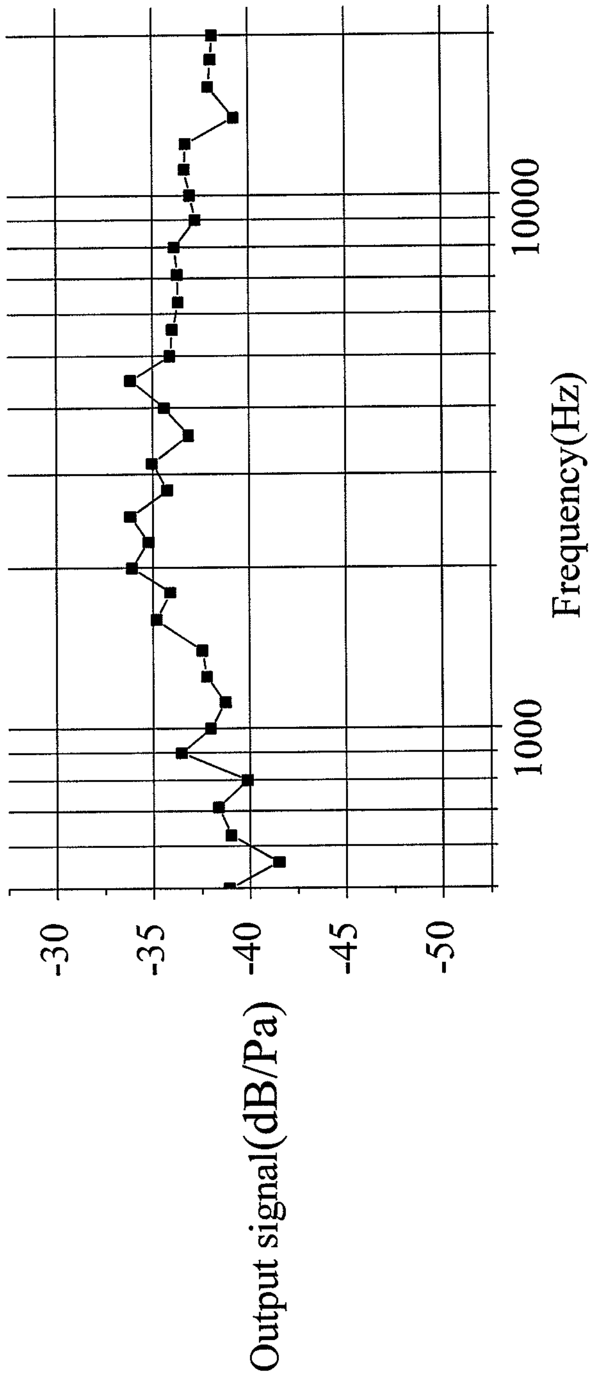
FIG. 6 is a diagram showing the result of a test under different frequencies of an MEMS capacitive microphone according to one embodiment of the present invention.

Refer to FIG. 6 for a diagram showing the result of a test under different frequencies of an MEMS capacitive microphone according to one embodiment of the present invention, wherein the MEMS capacitive microphone 20 is electrically connected with a capacitance readout IC (MS3110) and placed in a semi-anechoic chamber to receive signals from a loudspeaker. When the sound level is below 94 dB, the MEMS capacitive microphone 20 can sense a frequency of sound of 10-20000 Hz. The MEMS capacitive microphone 20 has a sensitivity of about 12.63 mV/Pa or −37.97 dB/Pa. The MEMS capacitive microphone 20 has advantages of high sensitivity, compactness and low cost. Further, the rigid diaphragm 22 of the MEMS capacitive microphone 20 is less likely to have residual stress and thus has higher sensitivity in comparison with the conventional flexible diaphragm.

It should be explained that "rigid" of the rigid diaphragm 22 is not defined by the hardness thereof but related to capacitive sensing principle thereof. As described above, the rigid diaphragm 22 means that the diaphragm is incorporated with the elastic element 23 to change the capacitance between the rigid diaphragm 22 and the back plate 24 due to the elasticity or deformation of the elastic element 23 but not the deformation of the diaphragm itself. Further, the realizations of the elastic element 23 are not limited to those in abovementioned embodiments.

The embodiments described above are only to exemplify the present invention but not to limit the scope of the present invention. Any equivalent modification or variation according to the technical contents of the specification or drawings is to be also included within the scope of the present invention.

What is claimed is:

1. A micro electro-mechanical system capacitive microphone, comprising:

a base including a back chamber formed thereon;

a back plate arranged in the base and including a plurality of air holes interconnecting with the back chamber;

an elastic element arranged in the base;

a rigid diaphragm arranged on the elastic element and parallel to the back plate; and an anchor element arranged between the rigid diaphragm and the elastic element to secure the rigid diaphragm to the elastic element;

whereby when a sound wave acts on the rigid diaphragm, the rigid diaphragm is moved parallel to a normal of the back plate by elasticity of the elastic element.

2. The micro electro-mechanical system capacitive microphone according to claim 1, wherein the rigid diaphragm is formed in a circular shape, and includes a center supported by the anchor element.

3. The micro electro-mechanical system capacitive microphone according to claim 1, wherein the rigid diaphragm further comprises a plurality of reinforcing members arranged on one side of the rigid diaphragm.

4. The micro electro-mechanical system capacitive microphone according to claim 1, wherein the back plate further comprises a plurality of reinforcing members arranged on one side of the back plate.

5. The micro electro-mechanical system capacitive microphone according to claim 1, wherein the base is made of silicon.

6. The micro electro-mechanical system capacitive microphone according to claim 1, wherein the rigid diaphragm and the back plate are made of silicon of polycrystalline.

7. The micro electro-mechanical system capacitive microphone according to claim 1 further comprising at least one insulation element arranged between the rigid diaphragm and the back plate to prevent the rigid diaphragm from electrically contacting the back plate.

8. The micro electro-mechanical system capacitive microphone according to claim 7, wherein the insulation element is made of silicon nitride.

* * * * *